(12) United States Patent
Wang et al.

(10) Patent No.: US 7,375,670 B1
(45) Date of Patent: May 20, 2008

(54) DIGITAL-TO-ANALOG CONVERTER

(75) Inventors: Ling Yun Wang, Fonghua Village (TW); Ming-Cheng Chiu, Fonghua Village (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/563,321

(22) Filed: Nov. 27, 2006

(51) Int. Cl.
*H03M 1/66* (2006.01)
(52) U.S. Cl. ...................... 341/145; 341/144
(58) Field of Classification Search ............. 341/118, 341/144, 145, 154, 159
See application file for complete search history.

(56) References Cited

U.S. PATENT DOCUMENTS 4,811,017 A * 3/1989 Gulczynski ............... 341/145
6,163,289 A * 12/2000 Ginetti ...................... 341/145
6,191,720 B1 * 2/2001 Zhang ....................... 341/145

* cited by examiner

*Primary Examiner*—Brian Young

(57) ABSTRACT

A DAC is provided to convert an input word into dual output voltages, and the input word includes a least significant bit and remaining bits. The DAC includes an R-string DAC section and a selecting section. The R-string DAC section is capable of providing an nth and (n+2)th voltage levels according to the remaining bits. The selecting section includes a first multiplexer and a second multiplexer. The first multiplexer is coupled to the R-string DAC section to provide a first output voltage according to a panel polarity signal. The second multiplexer is coupled to the R-string DAC section to provide a second output voltage according to the LSB bit of the N-bit input word. The DAC may further include an operational amplifier to average the dual output voltages for producing an analog output signal.

13 Claims, 3 Drawing Sheets

, $V_{254}$,

DIGITAL-TO-ANALOG CONVERTER

CROSS-REFERRENCE TO RELATED APPLICATIONS

This application is related to U.S. application Ser. No. 11/168,334, filed on Jun. 29, 2005, which is hereby incorporated by reference in its entirety.

BACKGROUND

1. Field of Invention

The present invention relates to digital-to-analog converters. More particularly, the present invention relates to a digital-to-analog converter having two sections for processing an input word.

1. Description of Related Art

There are many different types of digital-to-analog converters (DAC) available, such as a resistor string (R-string) DAC. FIG. 1 illustrates a conventional R-string DAC. An R-string DAC 100 includes a resistor string of resistors 110 and a selector 120. The selector 120 includes selecting lines 124 each of which is composed of switching elements 122. Each switching element 122 is controlled by one of the bits of an input word.

The resistor string is connected between a high reference voltage ($V_H$) and a low reference voltage ($V_L$). Each of the selecting lines 124 is connected to one of the nodes in the resistor string. Only one of the selecting lines 124 has switches all turned on by the input word and couples the voltage on the corresponding node in the resistor string to the output node Vo.

For N-bit digital-to-analog conversion, the R-string DAC 100 requires $2^N$ selecting lines. Moreover, each of the selected lines 124 requires N switching elements. Therefore, $2^N \times N$ switching elements are required for the N-bit R-string DAC 100. The number of switching elements dramatically increases when the bits of the input word are increased, which results in a larger layout area. This is disadvantageous for chip shrinkage and cost reduction.

SUMMARY

It is therefore an aspect of the present invention to provide a DAC, of which the circuit loading is lowered and the layout area is decreased.

According to one embodiment of the present invention, the DAC is provided to convert an input word into dual output voltages, and the input word includes a least significant bit (LSB) and remaining bits. The DAC includes an R-string DAC section and a selecting section. The R-string DAC section is capable of providing an nth and (n+2)th voltage levels according to the remaining bits.

The selecting section includes a first multiplexer and a second multiplexer. The first multiplexer is coupled to the R-string DAC section to provide a first output voltage according to a panel polarity signal. The second multiplexer is coupled to the R-string DAC section to provide a second output voltage according to the LSB bit of the N-bit input word.

The DAC may further include an operational amplifier to average the dual output voltages for producing an analog output signal.

In conclusion, an input word includes an LSB bit and remaining bits. A R-string DAC section is capable of providing an nth and (n+2)th voltage levels according to the remaining bits, which has one less switching element for each of the selected lines results in fewer switching elements needed compared to the conventional N-bit R-string DAC. Therefore, the circuit loading of the DAC is effectively lowered and the layout area is decreased. Further, a selecting section is coupled to the R-string DAC section to provide dual output voltages according to the LSB bit and a panel polarity signal. An operational amplifier may be adopted to average the dual output voltages to produce an analog output signal.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
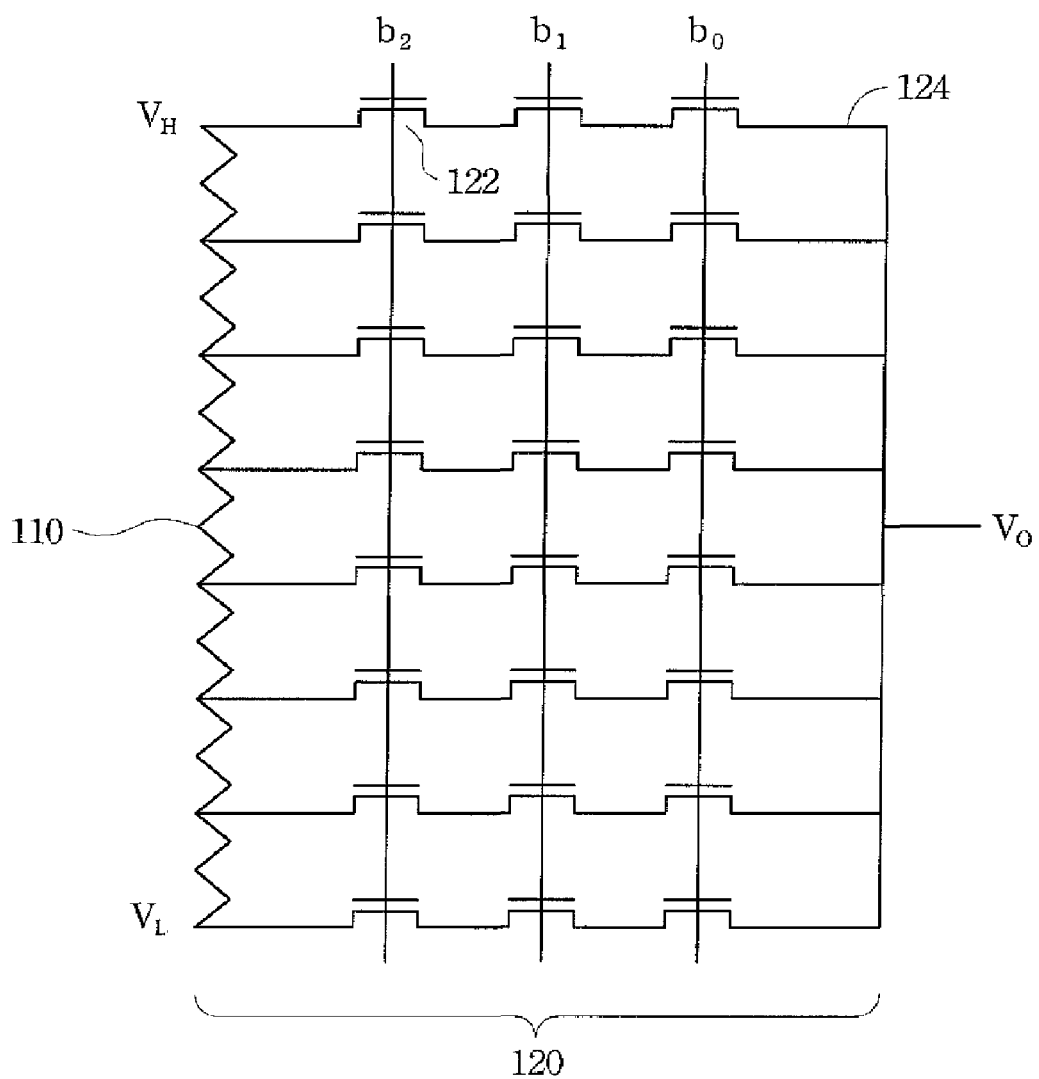
FIG. 1 illustrates a conventional R-string DAC.

Reference will now be made in detail to the present embodiments of the invention, examples of which are illustrated in the accompanying drawings. Wherever possible, the same reference numbers are used in the drawings and the description to refer to the same or like parts.

Figure 2:
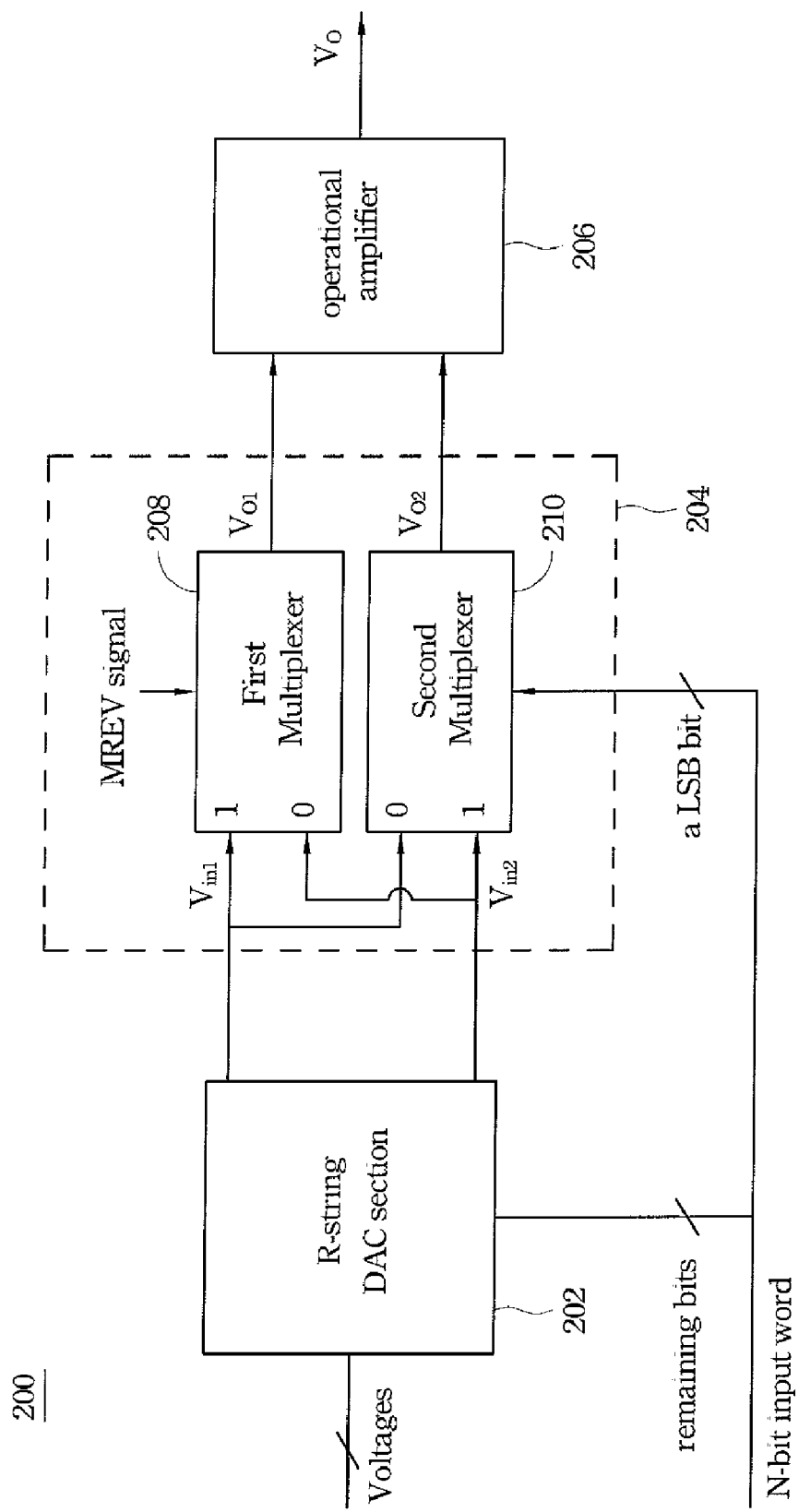
FIG. 2 illustrates one embodiment of the present invention.

FIG. 2 illustrates one embodiment of the present invention. A DAC 200 converts an input word into dual output voltages $V_{O1}$ and $V_{O2}$. An input word includes a least significant bit (LSB) and remaining bits. An 8-bit input word $B_7B_6B_5B_4B_3B_2B_1B_0$ includes an LSB bit $B_0$ and remaining bits $B_7B_6B_5B_4B_3B_2B_1$. The DAC 200 includes an R-string DAC section 202 and a selecting section 204. The R-string DAC section 202 is capable of providing an nth and (n+2)th voltage levels according to the remaining bits of the input word. The selection section 204 provides dual output voltages $V_{O1}$ and $V_{O2}$. The selection section 204 includes a first multiplexer 208 and a second multiplexer 210. The first multiplexer 208 is coupled to the R-string DAC section 202. The first multiplexer 208 provides a first output voltage $V_{O1}$ according to a panel polarity signal (e.g. an MREV signal). The second multiplexer 210 is coupled to the R-string DAC section 202. The second multiplexer 210 provides a second output voltage $V_{O2}$ according to the LSB bit of the input word.

The DAC 200 may include an operational amplifier 206. The operation amplifier 206 is coupled to the selecting section 204, and averages the dual output voltages $V_{O1}$ and $V_{O2}$ to produce an analog output signal $V_O$.

Figure 3:
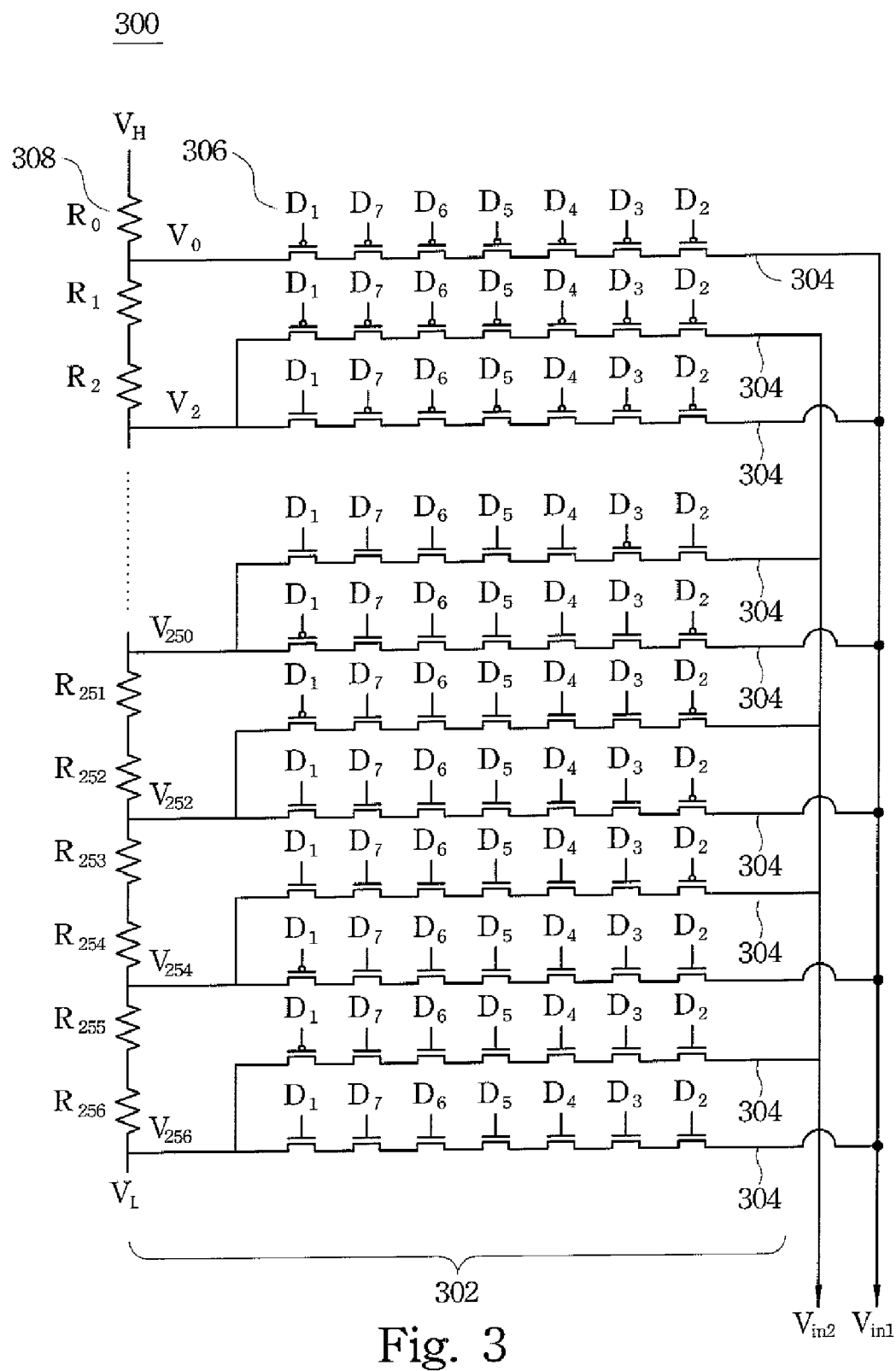
FIG. 3 illustrates one embodiment of the R-string DAC section.

FIG. 3 illustrates one embodiment of the R-string DAC section. An R-string DAC section 300 includes a voltage generator and a 2-of-N selector 302. The voltage generator is capable of providing voltage levels $V_0, V_2, \ldots, V_{254}, V_{256}$. The voltage levels $V_0, V_2, \ldots V_{256}$ are the even-numbered discrete analog voltages for digital-to-analog conversion of an 8-bit input word. The voltage generator includes resistors 308 electrically connected in series between a high reference voltage ($V_H$) and a low reference voltage ($V_L$) to provide voltage levels $V_0, V_2, \ldots, V_{254}$, $V_{256}$. The 2-of-N selector 302 is coupled to the voltage generator, and selects an nth voltage level and an (n+2)th voltage level [for example, ($V_0$ and $V_2$) or ($V_{252}$ and $V_{254}$) voltage levels] according to the remaining bits.

More particularly, the 2-of-N selector 302 has selecting lines 304 correspondingly coupled to the voltage generator and selects the nth voltage level and the (n+2)th voltage level. For the 8-bit DAC, each of the selecting lines 304 includes 7 switching elements 306 [(total number bits of the input word-1) of switching elements], and each of the switching elements 306 ($D_7D_6D_5D_4D_3D_2D_1$) is controlled by one of the remaining bits ($B_7B_6B_5B_4B_3B_2B_1$). The switching elements 306 comprise PMOS and NMOS transistors. These transistors are arranged so that two adjacent voltage levels $V_n$ and $V_{n+2}$ are respectively output to the nodes $V_{in1}$ and $V_{in2}$ when the remaining bits ($B_7B_6B_5B_4B_3B_2B_1$) are received, where n is an integer between 0 and 254. More specifically, when the remaining bits 0000000 are received, the voltage levels $V_0$ and $V_2$ are respectively output as the voltages $V_{in1}$ and $V_{in2}$. When the remaining bits 1111111 are received, the voltage levels $V_{254}$ and $V_{256}$ are respectively output as the voltages $V_{in1}$ and $V_{in2}$.

Referring to FIG. 2, the first input terminal (1) of the first multiplexer 208 and the second input terminal (0) of the second multiplexer 210 are coupled to $V_{in1}$ voltage level, the second input terminal (0) of the first multiplexer 208 and the first input terminal (1) of the second multiplexer 210 are coupled to the $V_{in2}$ voltage level.

The first multiplexer 208 selects one of the voltages $V_{in1}$ and $V_{in2}$ as the first output voltage $V_{O1}$ according to the panel polarity signal MREV signal, and the second multiplexer 210 selects one of the voltages $V_{in1}$ and $V_{in2}$ as the second output voltage $V_{O2}$ according to the LSB bit of the input word. More particularly, the first multiplexer 208 selects the voltage $V_{in1}$ as the first output voltage $V_{O1}$ while the panel polarity signal has a high logic level, and the first multiplexer 208 selects the voltage $V_{in2}$ as the first output voltage $V_{O1}$ while the panel polarity signal has a low logic level. The second multiplexer 210 selects the voltage $V_{in2}$ as the second output voltage $V_{O2}$ while the LSB bit of the input word has a high logic level, the second multiplexer 210 selects the voltage $V_{in1}$ as the second output voltage $V_{O2}$ while the LSB bit of the input word has a low logic level.

For clarity, Table 1 shows the voltage levels of the signals $V_{in1}$, $V_{in2}$, $V_{O1}$, $V_{O2}$ and $V_O$ for different input words and logic levels of the signal MREV.

TABLE 1

| | Input word | $V_{in1}$ | $V_{in2}$ | $V_{O1}$ | $V_{O2}$ | $V_O$ |
|---|---|---|---|---|---|---|
| MREV = 1 | 00,000,000 | V0 | V2 | V0 | V0 | V0 |
| MREV = 0 | 11,111,111 | V254 | V256 | V256 | V256 | V256 |
| MREV = 1 | 00,000,001 | V0 | V2 | V0 | V2 | V1 |
| MREV = 0 | 11,111,110 | V254 | V256 | V256 | V254 | V255 |

Those skilled in the art will appreciate that the MREV signal is the panel polarity signal for data inversion. The MREV signal may be used for the flat display of the mobile phone. Referring to row 2 of Table 1, when the input word is 00,000,000, the $V_{in1}$ is equal to V0, and the $V_{in2}$ is equal to V2. The MREV signal has a high logic level so that V0 is selected as the first output voltage $V_{O1}$. V0 is selected as the second output voltage $V_{O2}$ since the LSB of the input word is 0.

Referring to row 3 of Table 1, when the input word is 11,111,111, the $V_{in1}$ is equal to V254, and the $V_{in2}$ is equal to V256. The MREV signal has a low logic level so that V256 is selected as the first output voltage $V_{O1}$. V256 is also selected as the second output voltage $V_{O2}$ since the LSB of the input word is 1.

The operation amplifier 206 is coupled to the selecting section 204, and is capable of averaging the dual output voltages $V_{O1}$ and $V_{O2}$ to produce an analog output signal $V_O$, i.e., the analog output signal $V_O$ is equal to ($V_{O1}$+$V_{O2}$)/2. For the input word "00000000", both the voltages $V_{O1}$ and $V_{O2}$ are V0 so that $V_O$=(V0+V0)/=V0. For the input word "00000001", the voltages $V_{O1}$ and $V_{O2}$ are respectively V0 and V2 so that $V_{O=(V0+V2)}/2$=V1

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog converter (DAC), for converting an input word into dual output voltages, wherein the input word comprises a least significant bit (LSB) and remaining bits, the DAC comprising:
    an R-string DAC section for providing an nth and (n+2)th voltage levels according to the remaining bits; and
    a selecting section, comprising:
        a first multiplexer, coupled to the R-string DAC section to provide a first output voltage according to a panel polarity signal; and
        a second multiplexer, coupled to the R-string DAC section to provide a second output voltage according to the LSB bit of the input word, wherein the first multiplexer selects one of the nth and (n+2)th voltage levels to be the first output voltage, and the second multiplexer selects one of the nth and (n+2)th voltage levels to be the second output voltage.

2. The DAC as claimed in claim 1, wherein the R-string DAC section further comprises:
    a voltage generator, capable of generating a plurality of voltage levels; and
    a 2-of-N selector having a plurality of selecting lines correspondingly coupled to the voltage generator to provide the corresponding voltage levels, and each of the selecting lines comprises (total number bits of the input word-1) series-connected switching elements, wherein each of the switching elements is switched by one of the remaining bits.

3. The DAC as claimed in claim 2, wherein the voltage generator comprises a plurality of resistors electrically connected in series to provide the voltage levels.

4. The DAC as claimed in claim 1, wherein the first multiplexer selects the nth voltage level to be the first output voltage while the panel polarity signal is high, the first multiplexer selects the (n+2)th voltage level to be the first output voltage while the panel polarity signal is low.

5. The DAC as claimed in claim 1, wherein the second multiplexer selects the (n+2)th voltage level to be the second output voltage while the LSB bit of the input word is high, the second multiplexer selects the nth voltage level to be the second output voltage while the LSB bit of the input word is low.

6. The DAC as claimed in claim 1, wherein the voltage levels are grayscale voltages.

7. A digital-to-analog converter (DAC), for converting an input word into an analog output signal, wherein the input word comprises a least significant bit (LSB) and remaining bits, the DAC comprising:
- an R-string DAC section for providing an nth and (n+2)th voltage levels according to the remaining bits; and
- a selecting section for providing dual output voltages, comprising:
  - a first multiplexer, coupled to the R-string DAC section to provide a first output voltage according to a panel polarity signal; and
  - a second multiplexer, coupled to the R-string DAC section to provide a second output voltage according to the LSB bit of the N-bit input word; and
- an operational amplifier, coupled to the dual output voltages, is capable of averaging the dual output voltages to generate the analog output signal.

8. The DAC as claimed in claim 7, wherein the R-string DAC section further comprises:
- a voltage generator, capable of generating a plurality of voltage levels; and
- a 2-of-N selector having a plurality of selecting lines correspondingly coupled to the voltage generator to provide the corresponding voltage levels, and each of the selecting lines comprises (total number bits of the input word-1) series-connected switching elements, wherein each of the switching elements is switched by one of the remaining bits.

9. The DAC as claimed in claim 8, wherein the voltage generator comprises a plurality of resistors electrically connected in series to provide the voltage levels.

10. The DAC as claimed in claim 7, wherein the first multiplexer selects one of the nth and (n+2)th voltage levels to be the first output voltage, and the second multiplexer selects one of the nth and (n+2)th voltage levels to be the second output voltage.

11. The DAC as claimed in claim 10, wherein the first multiplexer selects the nth voltage level to be the first output voltage while the panel polarity signal is high, the first multiplexer selects the (n+2)th voltage level to be the first output voltage while the panel polarity signal is low.

12. The DAC as claimed in claim 10, wherein the second multiplexer selects the (n+2)th voltage level to be the second output voltage while the LSB bit of the input word is high, the second multiplexer selects the nth voltage level to be the second output voltage while the LSB bit of the input word is low.

13. The DAC as claimed in claim 7, wherein the voltage levels are grayscale voltages.

* * * * *